(12) United States Patent
Arai et al.

(10) Patent No.: US 6,284,394 B1
(45) Date of Patent: Sep. 4, 2001

(54) ORGANIC ELECTROLUMINESCENT DEVICE

(75) Inventors: Michio Arai; Isamu Kobori; Etsuo Mitsuhashi, all of Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/239,965

(22) Filed: Jan. 29, 1999

(30) Foreign Application Priority Data

Jan. 27, 1999 (JP) .................................................. 11-018776

(51) Int. Cl.$^7$ ............................ B32B 33/00; H05B 33/04
(52) U.S. Cl. ........................ 428/690; 428/917; 313/504; 313/505; 313/506
(58) Field of Search ................................. 428/690, 917; 313/504, 506, 505

(56) References Cited

U.S. PATENT DOCUMENTS

| | | | |
|---|---|---|---|
| 5,909,081 | * 6/1999 | Eida et al. ........................... | 313/504 |
| 5,952,779 | 9/1999 | Arai et al. . | |
| 5,969,474 | 10/1999 | Arai . | |
| 5,981,092 | 11/1999 | Arai et al. ........................... | 428/690 |
| 6,111,274 | * 8/2000 | Arai ..................................... | 257/96 |

FOREIGN PATENT DOCUMENTS

| | | |
|---|---|---|
| 196 25 993 | 1/1998 | (DE) . |
| 0 668 620 | 8/1995 | (EP) . |
| 0 740 489 | 10/1996 | (EP) . |
| 09-260062 | 10/1997 | (JP) . |
| WO 97/42666 | 11/1997 | (WO) . |
| WO 98/10473 | 3/1998 | (WO) . |

* cited by examiner

*Primary Examiner*—Cynthia Harris Kelly
*Assistant Examiner*—Dawn L. Garrett
(74) *Attorney, Agent, or Firm*—Oblon, Spivak, McClelland, Maier & Neustadt, P.C.

(57) ABSTRACT

The organic EL device of the present invention fulfils the object of realizing an EL device which exhibits an excellent electron and hole injecting efficiency and an improved light emitting efficiency and which can be operated at a low drive voltage and manufactured at a reduced cost. In order to attain such object, the organic EL device comprises a hole injecting electrode, an electron injecting electrode, and one or more organic layers between the electrodes wherein at least one of said organic layers has a light emitting function. A high resistivity inorganic electron injecting layer is provided between said organic layer and said electron injecting electrode. This layer comprises a first component comprising at least one oxide of an element selected from alkali metal elements, alkaline earth metal elements, and lanthanide elements, and a second component comprising at least one metal having a work function of 3 to 5 eV, and this layer has conduction paths for hole blockage and electron transportation. An inorganic insulative hole injecting and transporting layer is provided between the light emitting layer and the hole injecting layer. This layer contains oxide of silicon and/or germanium as its main component, and such main component has an average composition of:

$$(Si_{1-x}Ge_x)O_y$$

wherein $0 \leq x \leq 1$ and $1.7 \leq y \leq 1.99$.

8 Claims, 2 Drawing Sheets

ORGANIC ELECTROLUMINESCENT DEVICE

BACKGROUND OF THE INVENTION

1. Technical Field

This invention relates to an organic electroluminescent (EL) device, and more particularly, to an inorganic/organic junction structure suitable for use in a device of the type wherein an electric field is applied to a thin film of an organic compound to emit light.

2. Background Art

Organic EL devices have enabled to form a device of large area on a glass, and considerable research and development on such organic EL devices have gone on for their use as a display. In general, organic EL devices have a basic configuration including a glass substrate, a transparent electrode of ITO etc., a hole transporting layer of an organic amine compound, an organic light emitting layer of a material exhibiting electronic conductivity and intense light emission such as Alq3, and an electrode of a low work function metal such as MgAg, wherein the layers are stacked on the substrate in the described order.

The device configurations which have been reported thus far have one or more organic compound layers interposed between a hole injecting electrode and an electron injecting electrode. The organic compound layers are typically of two- or three-layer structure.

Included in the two-layer structure are a structure having a hole transporting layer and a light emitting layer formed between the hole injecting electrode and the electron injecting electrode and another structure having a light emitting layer and an electron transporting layer formed between the hole injecting electrode and the electron injecting electrode. Included in the three-layer structure is a structure having a hole transporting layer, a light emitting layer, and an electron transporting layer formed between the hole injecting electrode and the electron injecting electrode. Also known is a one-layer structure wherein a single layer playing all the roles is formed from a polymer or a mixed system.

FIGS. 3 and 4 illustrate typical configurations of organic EL devices.

In FIG. 3, a hole transporting layer 14 and a light emitting layer 15 of organic compounds are formed between a hole injecting electrode 12 and an electron injecting electrode 13 on a substrate 11. In this configuration, the light emitting layer 15 also serves as an electron transporting layer.

In FIG. 4, a hole transporting layer 14, a light emitting layer 15, and an electron transporting layer 16 of organic compounds are formed between a hole injecting electrode 12 and an electron injecting electrode 13 on a substrate 11.

Attempts have been made to improve the luminous efficiency of these organic EL devices. With the prior art device configuration, however, for reasons of poor hole blocking of the electron injecting and transporting layer, it was difficult to achieve efficient recombination of electrons with holes in the light emitting layer and hence, to provide a device with a fully satisfactory efficiency.

SUMMARY OF THE INVENTION

An object of the present invention is to provide an organic EL device having an excellent electron and hole injecting efficiency and improved light emitting efficiency, which can be manufactured at reduced cost and which can be operated at low drive voltage.

This and other objects are achieved by the present invention which is defined below.

(1) An organic electroluminescent device comprising a hole injecting electrode, a negative electrode, and at least one organic layer between the electrodes; wherein
at least one of said at least one organic layer has a light emitting function;
a high resistivity inorganic electron injecting layer is provided between said light emitting layer and said negative electrode,
said high resistivity inorganic electron injecting layer comprising
a first component having a work function of up to 4 eV which is oxide of at least one member selected from alkaline metal elements, alkaline earth metal elements, and lanthanoid elements, and
a second component having a work function of 3 to 5 eV which is at least one metal, and
said high resistivity inorganic electron injecting layer having conduction paths for hole blockage and electron transportation; and
an inorganic insulative hole injecting and transporting layer is provided between said light emitting layer and said hole injecting layer,
said inorganic insulative hole injecting and transporting layer containing oxide of silicon and/or germanium as its main component, and said main component having an average composition of:

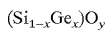

wherein $0 \leq x \leq 1$ and $1.7 \leq y \leq 1.99$.

(2) The organic electroluminescent device of (1) wherein said second component is at least one member selected from Zn, Sn, V, Ru, Sm and In.

(3) The organic electroluminescent device of (1) wherein said alkaline metal element is at least one member selected from Li, Na, K, Rb, Cs, and Fr; said alkaline earth metal element is at least one member selected from Mg, Ca and Sr; and said lanthanoid element is at least one member selected from La and Ce.

(4) The organic electroluminescent device of (1) wherein said high resistivity hole injecting layer has a resistivity of 1 to $1 \times 10^{11}$ Ω·cm.

(5) The organic electroluminescent device of (1) wherein said high resistivity inorganic electron injecting layer contains 0.2 to 40 mol % of said second component based on the entire components.

(6) The organic electroluminescent device of (1) wherein said high resistivity inorganic electron injecting layer has a thickness of 0.3 to 30 nm.

(7) The organic electroluminescent device of (1) wherein said inorganic insulative hole injecting and transporting layer further comprises silicon oxide and/or germanium oxide as its stabilizer.

(8) The organic electroluminescent device of (1) wherein said inorganic insulative hole injecting and transporting layer has a thickness of 0.1 to 5 nm.

DESCRIPTION OF PREFERRED EMBODIMENTS

Figure 1:
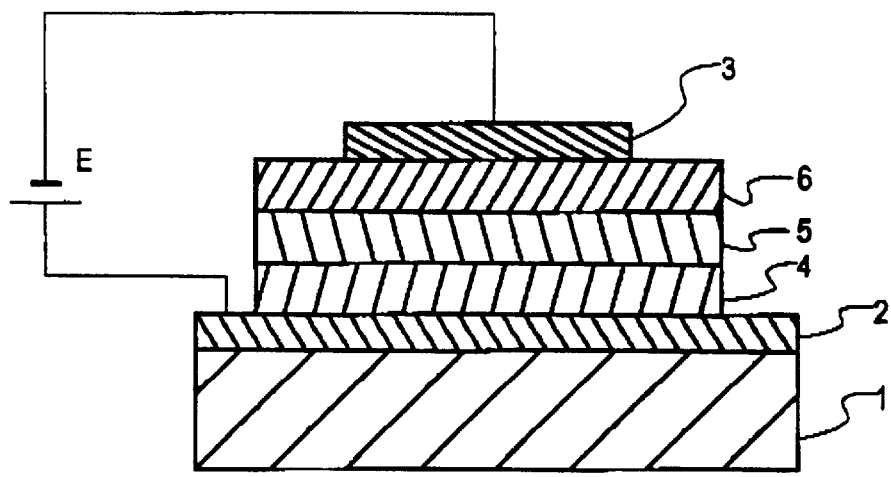
FIG. 1 is a schematic cross-sectional view illustrating the first basic configuration of the organic EL device according to the invention.

The organic electroluminescent device of the present invention comprises a hole injecting electrode, a negative electrode, and one or more organic layers between the electrodes, and at least one of said organic layers has a light emitting function. A high resistivity inorganic electron injecting layer is disposed between the light emitting layer and the negative electrode, and this high resistivity inorganic electron injecting layer comprises a first component having a work function of up to 4 eV which is oxide of at least one member selected from alkali metal elements, alkaline earth metal elements, and lanthanide elements, and a second component of at least one metal having a work function of 3 to 5 eV. The high resistivity inorganic electron injecting layer has conduction paths for hole blockage and electron transportation. An inorganic insulative hole injecting and transporting layer is provided between the light emitting layer and the hole injecting layer, and this inorganic insulative hole injecting and transporting layer contains oxide of silicon and/or germanium as its main component. This main component has an average composition represented by

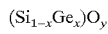

wherein $0 \leq x \leq 1$ and $1.7 \leq y \leq 1.99$.

By providing such high resistivity inorganic electron injecting layer which has electron conductive paths and which is capable of blocking the holes between the organic layer and the electron injecting electrode (negative electrode), efficient electron injection into the light emitting layer is enabled to realize increased light emitting efficiency and reduced drive voltage.

In addition, by adjusting the content of the second component to the range of 0.2 to 40 mol % based on the entire components in order to form electroconductive paths in the high resistivity inorganic electron injecting layer, efficient electron injection from the electron injecting electrode to the organic layer on the side of the light emitting layer is realized. Hole migration from the organic layer to the electron injecting electrode is also suppressed, ensuring effective recombination of holes and electrons in the light emitting layer. The organic EL device of the invention has both the merits of the inorganic materials and the merits of the organic materials, and produces a luminance equal to or greater than that of prior art devices having an organic electron injecting layer. Owing to high heat resistance and weather resistance, the organic EL device of the invention has a longer service life than the prior art devices and develops minimal leaks and dark spots. Since not only a relatively expensive organic material, but also an inexpensive, readily available, easy-to-prepare inorganic material are used, the cost of manufacture can be reduced.

The high resistivity inorganic electron injecting layer may preferably have a resistivity of 1 to $1 \times 10^{11}$ Ω·cm, and more preferably, a resistivity of $1 \times 10^3$ to $1 \times 10^8$ Ω·cm. When the resistivity of the high resistivity inorganic electron injecting layer is within such range, electron injection efficiency can be drastically increased without detracting from the high electron blockage. The resistivity of the high resistivity inorganic electron injecting layer can also be determined from sheet resistance and the thickness.

The high resistivity inorganic electron injecting layer preferably contains a first component which preferably has a work function of up to 4 eV, and more preferably 1 to 4 eV, and which is oxide of
- at least one alkaline metal element preferably selected from Li, Na, K, Rb, Cs and Fr; or
- at least one alkaline earth metal element preferably selected from Mg, Ca and Sr; or
- at least one lanthanide element preferably selected from La and Ce.

Among these, the preferred are lithium oxide, magnesium oxide, calcium oxide, and cerium oxide. When such oxides are used as a mixture, the oxides may be used at any mixing ratio, and the mixture may preferably contain at least 50 mol % of lithium oxide calculated in terms of $Li_2O$.

The high resistivity inorganic electron injecting layer preferably contains a second component which is at least an element selected from Zn, Sn, V, Ru, Sm and In. The content of the second component is preferably 0.2 to 40 mol %, and more preferably 1 to 20 mol %. When the content is below such range, electron injection function will be insufficient, while the content in excess of such range will result in an insufficient hole blockage function. When the second component comprises two or more members, the total content is preferably within the above-specified range. The second component may be either in the state of the metal element or in the state of its oxide.

Incorporation of the conductive (low resistivity) second component in the high resistivity first component is estimated to result in the formation of hopping paths for the electron injection since the conductive substance is located in the form of "islands" in the insulative substance.

The oxide of the first component is generally present in stoichiometric composition, but may deviate more or less therefrom and take non-stoichiometric compositions. This is the same for the second component which is generally present as an oxide.

The high resistivity inorganic electron injecting layer may further contain as impurities hydrogen as well as neon, argon, krypton, xenon and other elements which are used as the sputtering gas in a total amount of up to 5 at %.

As long as the overall high resistivity inorganic electron injecting layer has the above-described composition on the average, the layer need not be uniform in composition and may be of a structure having a graded concentration in the thickness direction.

The high resistivity inorganic electron injecting layer is normally amorphous.

The thickness of the high resistivity inorganic electron injecting layer is preferably 0.3 to 30 nm, and more preferably about 1 to about 20 nm. Function as the electron injecting layer would become insufficient when the thickness of the high resistivity inorganic electron injecting layer is outside the range.

Methods for preparing the high resistivity inorganic electron injecting layer include various physical and chemical thin film forming methods such as sputtering and vapor deposition, with the sputtering being preferred. The sputtering is preferably conducted by multi-target sputtering wherein the target for the first component and the target for the second component are separately sputtered since such multi-target sputtering enables independent selection of the optimal sputtering procedure for each target. In the case of single-target sputtering, the target used may comprise a mixture of the first and the second components.

When the high resistivity inorganic electron injecting layer is formed by sputtering, the sputtering gas is preferably under a pressure of 0.1 to 1 Pa during sputtering. The sputtering gas may be any of inert gases used in conventional sputtering equipment, for example, Ar, Ne, Xe, and Kr. Nitrogen ($N_2$) gas may be used if necessary. Reactive sputtering may be carried out in an atmosphere of the sputtering gas mixed with about 1 to about 99% of oxygen ($O_2$) gas.

The sputtering process may be an RF sputtering process using an RF power source or a DC reactive sputtering process, with the RF sputtering being especially preferred. The power of the sputtering equipment is preferably in the range of 0.1 to 10 W/cm² for RF sputtering. The deposition rate is preferably in the range of 0.5 to 10 nm/min., especially 1 to 5 nm/min.

The temperature of the substrate during deposition is from room temperature (25° C.) to about 150° C.

The inorganic insulative hole injecting layer contains oxide of silicon and/or germanium as its main component.

Preferably, the main component may have an average composition as determined by Rutherford back-scattering of

$(Si_{1-x}Ge_x)O_y$ wherein $0 \leq x \leq 1$ and $1.7 \leq y \leq 1.99$.

By limiting the composition of the oxide which constitutes the main component of the inorganic insulative electron injecting and transporting layer to the above-specified range, hole can be injected at a high efficiency from the hole injecting electrode to the organic layer on the side of the light emitting layer, and at the same time, migration of electrons from the organic layer to the hole injecting electrode is restrained to ensure effective recombination of the holes and the electrons in the light emitting layer. Since hole injection and transportation is intended, no light emission occurs with a reverse bias voltage applied. Therefore, the organic EL device produced by the present invention is effectively applicable to displays of the time-division drive mode which require a high luminance of light emission. The organic EL device produced by the present invention is also provided with an improved weather resistance, and has both the advantages of inorganic materials and the advantages of organic materials.

It suffices that y representative of the oxygen content falls within the above-defined composition range, that is, y is from 1.7 to 1.99. If y is outside this range, the layer has a reduced hole injecting capability, leading to a drop of luminance. Preferably y is from 1.85 to 1.98.

The inorganic insulative hole injecting and transporting layer may be a thin film of silicon oxide or germanium oxide or a mixture of silicon oxide and germanium oxide. Symbol x representative of the germanium to silicon ratio is $0 \leq x \leq 1$. Preferably x is up to 0.4, more preferably up to 0.3, and especially up to 0.2.

Alternatively, x is preferably at least 0.6, more preferably at least 0.7, and especially at least 0.8.

The content of oxygen represents an average composition within the film and is determined by Rutherford back-scattering. The average composition, however, may be determined by other analysis which has comparable precision.

Preferably, the inorganic insulative hole injecting and transporting layer may further contain at least one member selected from Cu, Fe, Ni, Ru, Sn and Au, and in particular, at least one member selected from Cu, Ni and Sn, and most preferably Ni. Content of such element is up to 10 at %, preferably 0.05 to 10 at %, more preferably 0.1 to 10 at %, and most preferably 0.5 to 5 at %. Content in excess of such range results in reduced hole injecting function. When two ore more elements are used, total content of the two or more elements is preferably within the range as described above.

The inorganic insulative hole injecting and transporting layer may further contain as impurities neon, argon, krypton, xenon and other elements which are used as the sputtering gas, preferably in a total amount of up to 10 at %, more preferably about 0.01 to 2 wt %, and especially about 0.05 to 1.5 wt %. These elements may be contained alone or in admixture of two or more. The mixture of two or more elements may have an arbitrary mix ratio.

These elements are used as the sputtering gas and thus introduced into the inorganic insulative hole injecting and transporting layer during its formation. If the content of these elements is too high, the trapping capability becomes extremely low and the desired performance is lost.

The content of the sputtering gas is determined by the pressure, the flow rate ratio of sputtering gas to oxygen, deposition rate, and other factors during film formation, especially the pressure during film formation. In order that the content of the sputtering gas fall within the above-described range, it is preferred to effect film deposition in higher vacuum, specifically in a vacuum of 1 Pa or lower, especially 0.1 to 1 Pa.

As long as the overall inorganic insulative hole injecting and transporting layer has the above-described composition on the average, the layer need not be uniform in composition and may be of a structure having a graded concentration in the thickness direction. In such a case, it is preferred that oxygen be poor on the interface side with the organic layer (light emitting layer).

The inorganic insulative hole injecting and transporting layer is normally amorphous.

The thickness of the inorganic insulative hole injecting layer is not particularly limited. The thickness, however, is preferably 0.05 to 10 nm, and most preferably about 1 to about 5 nm. Hole injection efficiency would become insufficient when the thickness of the inorganic insulative hole injecting and transporting layer is outside the range.

Methods for preparing high resistivity inorganic electron injecting and transporting layer and the inorganic insulative hole injecting and transporting layer include various physical and chemical thin film forming methods such as sputtering and EB vapor deposition, with the sputtering being preferred.

When the high resistivity inorganic electron injecting and transporting layer and the inorganic insulative hole injecting layer are formed by sputtering, the sputtering gas is preferably under a pressure of 0.1 to 1 Pa during sputtering. The sputtering gas may be any of inert gases used in conventional sputtering equipment, for example, Ar, Ne, Xe, and Kr. Nitrogen ($N_2$) gas may be used if necessary. Reactive sputtering may be carried out in an atmosphere of the sputtering gas mixed with about 1 to about 99% of oxygen ($O_2$) gas. The target used herein is the above-described oxide or oxides, and either single target or multi-target sputtering may be carried out.

The sputtering process may be an RF sputtering process using an RF power source or a DC. reactive sputtering process, with the RF sputtering being especially preferred. The power of the sputtering equipment is preferably in the range of 0.1 to 10 W/cm² for RF sputtering. The deposition rate is preferably in the range of 0.5 to 10 nm/min., especially 1 to 5 nm/min. The temperature of the substrate during deposition is from room temperature (25° C.) to about 150° C.

The sputtering process may be a reactive sputtering process using a reactive gas. The reactive gas may be $N_2$, $NH_3$, NO, $NO_2$, $N_2O$, or the like when nitrogen is to be introduced, and $CH_4$, $C_2H_2$, CO or the like when carbon is to be introduced. The reactive gas may be used either alone or in combination of two or more.

The organic EL device of the invention having provided therewith the high resistivity inorganic electron injecting layer and the inorganic insulative hole injecting and transporting layer has high heat resistance and weather resistance, and hence, a longer service life. Since not only relatively expensive organic materials, but also inexpensive, readily available, easy-to-prepare inorganic materials are used, manufacture of the device became easier and the cost of manufacture could also be reduced. Furthermore, connection with the electrode comprising an inorganic material, which has been the problem associated with the prior art devices, has been improved, and leaks and dark spots are thereby minimized.

Figure 2:
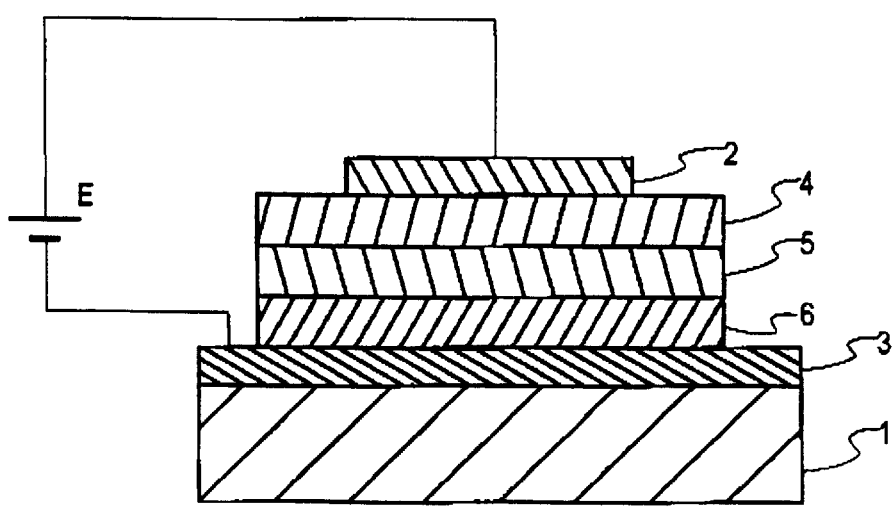
FIG. 2 is a schematic cross-sectional view illustrating the second basic configuration of the organic EL device according to the invention.
Figure 3:
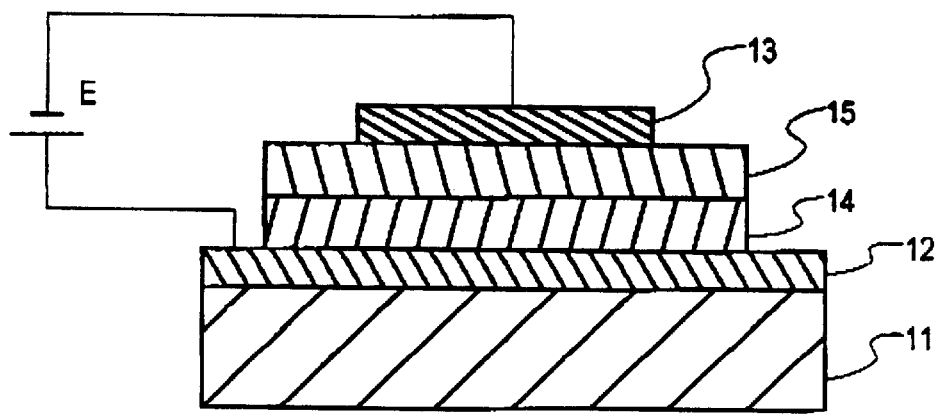
FIG. 3 is a schematic cross-sectional view illustrating the configuration of a prior art organic EL device.
Figure 4:
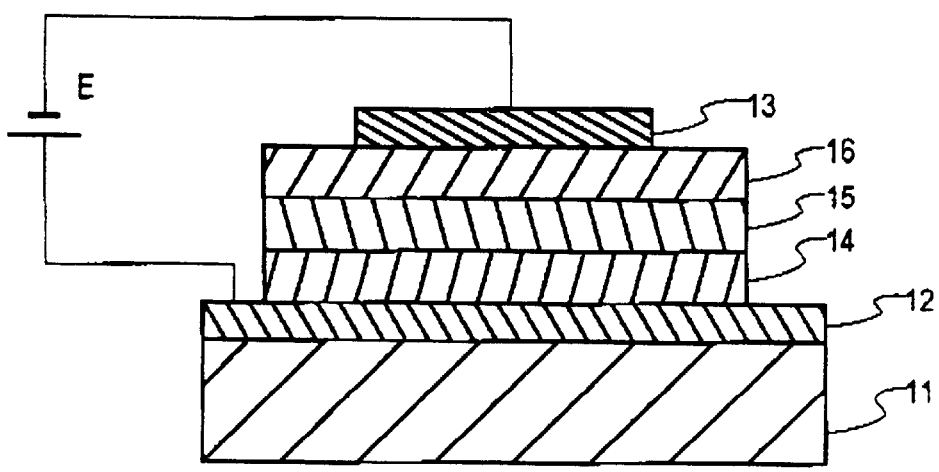
FIG. 4 is a schematic cross-sectional view illustrating the configuration of another prior art organic EL device.

As shown in FIG. 1, for example, the organic EL device of the invention may have the successively stacked configuration of substrate 1/hole injecting electrode 2/inorganic insulative hole injecting and transporting layer 4/light emitting layer 5/high resistivity inorganic electron injecting layer 6/negative electrode 3. As shown in FIG. 2, for example, the organic EL device of the invention may also have the successively stacked configuration of substrate 1/negative electrode 3/high resistivity inorganic electron injecting layer 6/light emitting layer 5/inorganic insulative hole injecting and transporting layer 4/hole injecting electrode 2, which is a configuration wherein the layers are successively stacked in an order reverse to usual order of stacking to thereby facilitate the light exit from the side opposite to the substrate. It is noted that when the high resistivity electron injecting layer is deposited, the organic layer or the like can be subjected to ashing and hence, damaged. Under such a situation, it is recommended that the high resistivity electron injecting layer is deposited as two layers, that is, the layer is initially thinly deposited in the absence of oxygen and then thickly in the presence of oxygen. The thickness reached in the absence of oxygen is preferably about $\frac{1}{5}$ to about $\frac{1}{2}$ of the overall thickness. In FIGS. 1 and 2, a drive power supply E is connected between the hole injecting electrode 2 and the negative electrode 3. The term high resistivity electron injecting layer 5 as used herein designates the high resistivity electron injecting layer in the broad sense, and includes electron transporting layer, the light emitting layer in the narrow sense, hole transporting layer, and the like.

The device of the invention may have a multi-stage configuration of electrode layer/inorganic layers and light emitting layer/electrode layer/inorganic layers and light emitting layer/electrode layer/inorganic layers and light emitting layer/electrode layer, or further repeated layers. Such a multi-stage configuration is effective for adjusting or multiplying the color of emitted light.

The electron injecting electrode (the negative electrode) used in combination with the high resistivity inorganic electron injecting layer is not necessarily capable of injecting electrons at low work function, and therefore, may be formed from a non-limited material which may be a common metal. The electron injecting electrode is preferably formed from one, two or some more metal elements selected from Al, Ag, In, Ti, Cu, Au, Mo, W, Pt, Pd and Ni, and in particular, from Al and Ag in view of the conductivity and the handling convenience.

Such negative electrode thin film may have at least a sufficient thickness to effect electron injection into the high resistivity inorganic electron injecting and transporting layer, for example, a thickness of at least 50 nm, and preferably at least 100 nm. Although the upper limit is not critical, the electrode thickness is typically about 50 to about 500 nm.

If desired, the electron injecting electrode may be formed from metal elements such as K, Li, Na, Mg, La, Ce, Ca, Sr, Ba, Sn, Zn, and Zr, and binary or ternary alloys containing such metal elements for stability improvement. Exemplary alloys are Ag—Mg (Ag: 0.1 to 50 at %), Al—Li (Li: 0.01 to 14 at %), In—Mg (Mg: 50 to 80 at %), and Al—Ca (Ca: 0.01 to 20 at %).

Such electron injecting electrode thin film may have at least a sufficient thickness to effect electron injection, for example, a thickness of at least 0.1 nm, preferably at least 0.5 nm, and more preferably at least 1 nm. Although the upper limit is not critical, the electrode thickness is typically about 1 to about 500 nm. On the electron injecting electrode, an auxiliary or protective electrode may be provided, if desired.

The auxiliary electrode may have at least a sufficient thickness to ensure efficient electron injection and prevent the ingress of moisture, oxygen and organic solvents, for example, a thickness of at least 50 nm, preferably at least 100 nm, more preferably 100 to 500 nm. A too thin auxiliary electrode layer would exert its effect little, lose a step coverage capability, and provide insufficient connection to a terminal electrode. If too thick, greater stresses are generated in the auxiliary electrode layer, accelerating the growth rate of dark spots.

For the auxiliary electrode, an appropriate material may be chosen in consideration of the material of the electron injecting electrode to be combined therewith. For example, low resistivity metals such as aluminum may be used when electron injection efficiency is of importance. Metal compounds such as TiN may be used when sealing is of importance.

The thickness of the electron injecting electrode and the auxiliary electrode combined is usually about 50 to about 500 nm though it is not critical.

For the hole injecting electrode, materials capable of effectively injecting holes into the inorganic insulated hole injecting and transporting layer and having the work function of 4.5 eV to 5.5 eV are preferred. Useful are compositions based on tin-doped indium oxide (ITO), zinc-doped indium oxide (IZO), indium oxide ($In_2O_3$), tin oxide ($SnO_2$) or zinc oxide (ZnO). These oxides may deviate more or less from their stoichiometric compositions. An appropriate proportion of $SnO_2$ mixed with $In_2O_3$ is about 1 to 20%, more preferably about 5 to 12 wt %. For IZO, an appropriate proportion of ZnO mixed with $In_2O_3$ is about 12 to 32 wt %.

The hole injecting electrode may further contain silicon oxide ($SiO_2$) for adjustment of the work function. The content of silicon oxide ($SiO_2$) is preferably about 0.5 to 10% as expressed in mol percent of $SiO_2$ based on ITO. The $SiO_2$ in the electrode contributes for the increase of the work function of the ITO.

The electrode on the light exit side should preferably have a light transmittance of at least 50%, more preferably at least 60%, further preferably at least 80%, especially at least 90% in the light emission band, typically from 400 to 700 nm, and especially at each light emission. With a lower transmittance, the light emitted by the light emitting layer is attenuated through the electrode, failing to provide a luminance necessary as a light emitting device. It is noted that the light transmittance of the electrode is sometimes set low for the purpose of increasing the contrast ratio for improving visual perception.

Preferably the electrode has a thickness of 50 to 500 nm, especially 50 to 300 nm. Although the upper limit of the electrode thickness is not critical, a too thick electrode would cause a drop of transmittance and separation. Too thin an electrode is insufficient for its effect and low in film strength during fabrication.

The light emitting layer comprises stacked thin layers of one or more organic compounds which are involved in the light emitting function.

The light emitting layer has the function of injecting the holes (positive holes) and the electrons, the function of transporting such holes and electrons, and the function of producing exciter by recombination of the holes and the electrons. By using a relatively neutral compound for the light emitting layer, the electrons and the holes can be readily injected and transported at a good balance.

The thickness of the light emitting layer is not particularly limited, and may vary by the method of formation. The light emitting layer, however, may generally have a thickness of about 5 to about 500 nm, and most preferably 10 to 300 nm.

The light emitting layer of the organic EL device contains a fluorescent material that is a compound having a light emitting function. The fluorescent material may be at least one member selected from compounds as disclosed, for example, in JP-A 264692/1988, such as quinacridone, rubrene, and styryl dyes. Also, quinoline derivatives such as metal complex dyes having 8-quinolinol or a derivative thereof as the ligand such as tris(8-quinolinolato)aluminum are included as well as tetraphenylbutadiene, anthracene, perylene, coronene, and 12-phthaloperinone derivatives. Further useful are the phenylanthracene derivatives described in JP-A 12600/1996 (Japanese Patent Application No. 110569/1994) and the tetraarylethene derivatives described in JP-A 12969/1996 (Japanese Patent Application No. 114456/1994).

It is preferred to use such a compound in combination with a host material capable of light emission by itself, that is, to use the compound as a dopant. In this embodiment, the content of the compound in the light emitting layer is preferably 0.01 to 10 wt %, especially 0.1 to 5 wt %. By using the compound in combination with the host material, the light emission wavelength of the host material can be altered, allowing light emission to be shifted to a longer wavelength and improving the luminous efficiency and stability of the device.

As the host material, quinolinolato complexes are preferable, with aluminum complexes having 8-quinolinol or a derivative thereof as the ligand being more preferable. These aluminum complexes are disclosed in JP-A 264692/1988, 255190/1991, 70733/1993, 258859/1993 and 215874/1994.

Illustrative examples include tris(8-quinolinolato)aluminum, bis(8-quinolinolato)magnesium, bis(benzo{f}-8-quinolinolato)zinc, bis(2-methyl-8-quinolinolato)aluminum oxide, tris(8-quinolinolato)indium, tris(5-methyl-8-quinolinolato)aluminum, 8-quinolinolatolithium, tris(5-chloro-8-quinolinolato)gallium, bis(5-chloro-8-quinolinolato)calcium, 5,7-dichloro-8-quinolinolatoaluminum, tris(5,7-dibromo-8-hydroxyquinolinolato)aluminum, and poly[zinc(II)-bis(8-hydroxy-5-quinolinyl)methane].

Also useful are aluminum complexes having another ligand in addition to 8-quinolinol or a derivative thereof. Examples include bis(2-methyl-8-quinolinolato)(phenolato)aluminum(III), bis(2-methyl-8-quinolinolato)(ortho-cresolato)aluminum(III), bis(2-methyl-8-quinolinolato)(meta-cresolato)aluminum(III), bis(2-methyl-8-quinolinolato)(para-cresolato)aluminum(III), bis(2-methyl-8-quinolinolato)(ortho-phenylphenolato)aluminum(III), bis(2-methyl-8-quinolinolato)(meta-phenylphenolato)aluminum(III), bis(2methyl-8-quinolinolato)(para-phenylphenolato)aluminum(III), bis(2-methyl-8-quinolinolato)(2,3-dimethylphenolato)aluminum(III), bis(2-methyl-8-quinolinolato)(2,6-dimethylphenolato)aluminum (III), bis(2-methyl-8-quinolinolato)(3,4-dimethylphenolato)aluminum(III), bis(2-methyl-8-quinolinolato)(3,5-dimethylphenolato)aluminum(III), bis(2-methyl-8-quinolinolato)(3,5-di-tert-butylphenolato)aluminum(III), bis(2-methyl-8-quinolinolato)(2,6-diphenylphenolato)aluminum(III), bis(2-methyl-8-quinolinolato)(2,4,6-triphenylphenolato)aluminum(III), bis(2-methyl-8-quinolinolato)(2,3,6-trimethylphenolato)aluminum(III), bis(2-methyl-8-quinolinolato)(2,3,5,6-tetramethylphenolato)aluminum(III), bis(2-methyl-8-quinolinolato)(1-naphtholato)aluminum(III), bis(2-methyl-8-quinolinolato)(2-naphtholato)aluminum(III), bis(2,4-dimethyl-8-quinolinolato)(ortho-phenylphenolato)aluminum(III), bis(2,4-dimethyl-8-quinolinolato)(para-phenylphenolato)aluminum(III), bis(2,4-dimethyl-8-quinolinolato)(meta-phenylphenolato)aluminum(III), bis(2,4-dimethyl-8-quinolinolato)(3,5-dimethylphenolato)aluminum(III), bis(2,4-dimethyl-8-quinolinolato)(3,5-di-tert-butylphenolato)aluminum(III), bis(2-methyl-4-ethyl-8-quinolinolato)(para-cresolato)aluminum(III), bis(2-methyl-4-methoxy-8-quinolinolato)(paraphenylphenolato)aluminum(III), bis(2-methyl-5-cyano-8-quinolinolato)(ortho-cresolato)aluminum (III), and bis(2-methyl-6-trifluoromethyl-8-quinolinolato)(2-naphtholato)aluminum(III).

Also acceptable are bis(2-methyl-8-quinolinolato)aluminum(III)-$\mu$-oxo-bis(2-methyl-8-quinolinolato)aluminum (III), bis(2,4-dimethyl-8-quinolinolato)aluminum(III)-$\mu$-oxo-bis(2,4-dimethyl-8-quinolinolato)aluminum (III), bis(4-ethyl-2-methyl-8-quinolinolato)aluminum(III)-$\mu$-oxo-bis(4-ethyl-2-methyl-8-quinolinolato)aluminum(III), bis(2-methyl-4-methoxyquinolinolato)aluminum(III)-$\mu$-oxo-bis(2-methyl-4-methoxyquinolinolato)aluminum(III), bis(5-cyano-2-methyl-8-quinolinolato)aluminum(III)-$\mu$-oxo-bis(5-cyano-2-methyl-8-quinolinolato)aluminum(III), and bis(2-methyl-5-trifluoromethyl-8-quinolinolato)aluminum(III)-$\mu$-oxo-bis(2-methyl-5-trifluoromethyl-8-quinolinolato)aluminum(III).

Other useful host materials are the phenylanthracene derivatives described in JP-A 12600/1996 (Japanese Patent Application No. 110569/1994) and the tetraarylethene derivatives described in JP-A 12969/1996 (Japanese Patent Application No. 114456/1994).

The light emitting layer may also serve as the electron injecting and transporting layer. In this case, tris(8-quinolinolato)aluminum etc. are preferably used. These fluorescent materials may be evaporated.

Also, if necessary, the light emitting layer may also be a layer of a mixture of at least one hole injecting and transporting compound and at least one electron injecting and transporting compound, in which a dopant is preferably contained. In such a mix layer, the content of the compound is preferably 0.01 to 20 wt %, especially 0.1 to 15 wt %.

In the mix layer, carrier hopping conduction paths are created, allowing carriers to move through a polarly predominant material while injection of carriers of opposite polarity is rather inhibited, and the organic compound becomes less susceptible to damage, resulting in the advantage of an extended device life. By incorporating the aforementioned dopant in such a mix layer, the light emission wavelength the mix layer itself possesses can be altered, allowing light emission to be shifted to a longer wavelength and improving the luminous intensity and stability of the device.

The hole injecting and transporting compound and electron injecting and transporting compound used in the mix layer may be selected from the hole injecting and transporting compounds and the electron injecting and transporting compounds to be described later, respectively. Inter alia, the hole injecting and transporting compound is preferably selected from amine derivatives having strong fluorescence, for example, triphenyldiamine derivatives which are hole transporting materials, styrylamine derivatives and amine derivatives having an aromatic fused ring.

The electron injecting and transporting compound is preferably selected from quinoline derivatives and metal complexes having 8-quinolinol or a derivative thereof as a ligand, especially tris(8-quinolinolato)aluminum (Alq3). The aforementioned phenylanthracene derivatives and tetraarylethene derivatives are also preferable.

As the hole injecting and transporting compound, amine derivatives having intense fluorescence are useful, for example, the triphenyldiamine derivatives, styrylamine derivatives, and amine derivatives having an aromatic fused ring, exemplified above as the hole injecting and transporting material.

The mix ratio is preferably determined in accordance with the carrier density and carrier mobility of the respective compounds. It is usually preferred that the weight ratio of the hole injecting and transporting compound to the electron injecting and transporting compound range from about 1/99 to about 99/1, more preferably from about 10/90 to about 90/10, especially from about 20/80 to about 80/20.

Also preferably, the thickness of the mix layer ranges from the thickness of a mono-molecular layer to less than the thickness of the organic compound layer. Specifically, the mix layer is preferably 1 to 85 nm, more preferably 5 to 60 nm, especially 5 to 50 nm thick.

Preferably the mix layer is formed by a co-deposition process of evaporating the compounds from distinct sources. If both the compounds have approximately equal or very close vapor pressures or evaporation temperatures, they may be pre-mixed in a common evaporation boat, from which they are evaporated together. The mix layer is preferably a uniform mixture of both the compounds although the compounds can be present in island form. The light emitting layer is generally formed to a predetermined thickness by evaporating an organic fluorescent material or coating a dispersion thereof in a resin binder.

If desired, an organic hole transporting layer and an organic electron transporting layer may be provided. The organic electron/hole transporting layer is a layer which has the function of facilitating injection of the electron/hole from the electron/hole injecting layer, the function of stably transporting the electron/hole, and the function of blocking the hole/electron. This layer is effective for increasing the number of holes and electrons injected into the light emitting layer and confining holes and electrons therein for optimizing the recombination region to improve luminous efficiency.

The thickness of the organic electron/hole transporting layer is not critical and varies with the particular formation technique although its thickness is usually preferred to range from about 5 nm to about 500 nm, especially 10 nm to 300 nm.

The thickness of the organic electron/hole transporting layer may be equal to or ranges from about 1/10 times to about 10 times the thickness of the light emitting layer although it depends on the design of a recombination/light emitting region.

In forming the organic electron/hole transporting layer and the light emitting layer, vacuum evaporation is preferably used because homogeneous thin films are available. By utilizing vacuum evaporation, there is obtained a homogeneous thin film which is amorphous or has a crystal grain size of up to 0.2 $\mu$m. If the grain size is in excess of 0.2 $\mu$m, uneven light emission would take place and the drive voltage of the device must be increased with a substantial drop of electron or hole injection efficiency.

The conditions for vacuum evaporation are not critical although a vacuum of $10^{-4}$ Pa or lower and a deposition rate of about 0.01 to 1 nm/sec. are preferred. It is preferred to successively form layers in vacuum because the successive formation in vacuum can avoid adsorption of impurities on the interface between the layers, thus ensuring better performance. Also, the drive voltage of a device can be reduced and the development and growth of dark spots be restrained.

In the embodiment wherein the respective layers are formed by vacuum evaporation, where it is desired for a single layer to contain two or more compounds, it is preferable that the boats having the compounds received therein are individually temperature controlled to achieve co-deposition.

Further preferably, a shield plate may be provided on the device in order to prevent the organic layers and electrodes from oxidation. In order to prevent the ingress of moisture, the shield plate is attached to the substrate through an adhesive resin layer for sealing. The sealing gas is preferably an inert gas such as argon, helium, and nitrogen. The sealing gas should preferably have a moisture content of less than 100 ppm, more preferably less than 10 ppm, especially less than 1 ppm. The lower limit of the moisture content is usually about 0.1 ppm though not critical.

The shield plate is selected from plates of transparent or translucent materials such as glass, quartz and resins, with glass being especially preferred. Alkali glass is preferred because of economy although other glass compositions such as soda lime glass, lead alkali glass, borosilicate glass, aluminosilicate glass, and silica glass are also useful. Of these, plates of soda glass without surface treatment are inexpensive and useful. Beside the glass plates, metal plates and plastic plates may also be used as the shield plate.

Using a spacer for height adjustment, the shield plate may be held at a desired height over the layer structure. The spacer may be formed from resin beads, silica beads, glass beads, and glass fibers, with the glass beads being especially preferred. Usually the spacer is formed from particles having a narrow particle size distribution while the shape of particles is not critical. Particles of any shape which does not obstruct the spacer function may be used. Preferred particles have an equivalent circle diameter of about 1 to 20 $\mu$m, more preferably about 1 to 10 $\mu$m, most preferably about 2 to 8 $\mu$m. Particles of such diameter should preferably have a length of less than about 100 $\mu$m. The lower limit of length is not critical although it is usually equal to or more than the diameter.

When a shield plate having a recess is used, the spacer may be used or not. When used, the spacer should preferably have a diameter in the above-described range, especially 2 to 8 $\mu$m.

The spacer may be premixed in a sealing adhesive or mixed with a sealing adhesive at the time of bonding. The content of the spacer in the sealing adhesive is preferably 0.01 to 30 wt %, more preferably 0.1 to 5 wt %.

Any of adhesives which can maintain stable bond strength and gas tightness may be used although UV curable epoxy resin adhesives of cation curing type are preferred.

In the organic EL structure of the invention, the substrate may be selected from amorphous substrates of glass and quartz and crystalline substrates of Si, GaAs, ZnSe, ZnS, GaP, and InP, for example. If desired, buffer layers of crystalline materials, amorphous materials or metals may be formed on such crystalline substrates. Metal substrates including Mo, Al, Pt, Ir, Au and Pd are also useful. Of these, glass substrates are preferred. Since the substrate is often situated on the light exit side, the substrate should preferably have a light transmittance as described above for the electrode.

A plurality of inventive devices may be arrayed on a plane. A color display is obtained when the respective devices of a planar array differ in emission color.

The substrate may be provided with a color filter film, a fluorescent material-containing color conversion film or a dielectric reflecting film for controlling the color of light emission.

The color filter film used herein may be a color filter as used in liquid crystal displays and the like. The properties of a color filter may be adjusted in accordance with the light emission of the organic EL device so as to optimize the extraction efficiency and color purity.

It is also preferred to use a color filter capable of cutting external light of short wavelength which is otherwise absorbed by the EL device materials and fluorescence conversion layer, because the light resistance and display contrast of the device are improved.

An optical thin film such as a multilayer dielectric film may be used instead of the color filter.

The fluorescence conversion filter film is to convert the color of light emission by absorbing electroluminescence and allowing the fluorescent material in the film to emit light. It is formed from three components: a binder, a fluorescent material, and a light absorbing material.

The fluorescent material used may basically have a high fluorescent quantum yield and desirably exhibits strong absorption in the electroluminescent wavelength region. In practice, laser dyes are appropriate. Use may be made of rhodamine compounds, perylene compounds, cyanine compounds, phthalocyanine compounds (including subphthalocyanines), naphthalimide compounds, fused ring hydrocarbon compounds, fused heterocyclic compounds, styryl compounds, and coumarin compounds.

The binder is selected from materials which do not cause extinction of fluorescence, preferably those materials which can be finely patterned by photolithography or printing technique. Also, where the filter film is formed on the substrate so as to be contiguous to the hole injecting electrode, those materials which are not damaged during deposition of the hole injecting electrode (such as ITO or IZO) are preferable.

The light absorbing material is used when the light absorption of the fluorescent material is short and may be omitted if unnecessary. The light absorbing material may also be selected from materials which do not cause extinction of fluorescence of the fluorescent material.

The organic EL device of the invention is generally of the dc or pulse drive type. The applied voltage is generally about 2 to 30 volts.

In addition to the display application, the organic EL device of the invention may find use as various optical devices such as optical pickups for use in reading and writing in storages, repeaters in transmission lines for optical communication, and photo couplers.

EXAMPLES

Examples of the invention are given below by way of illustration.

Example 1

A glass substrate (manufactured by Corning Glass Works under the designation of 7059) was scrubbed using a neutral detergent.

By RF magnetron sputtering from a target of ITO oxide, a hole injecting electrode layer of ITO having a thickness of 200 nm was formed on the substrate at a substrate temperature of 250° C.

After its ITO electrode-bearing surface was cleaned with $UV/O_3$, the substrate was secured by a holder in a sputtering chamber, which was evacuated to a vacuum of $1 \times 10^{-4}$ Pa or lower.

Next, using a target of $SiO_2$, an inorganic insulative hole injecting and transporting layer was deposited to a thickness of 2 nm. The sputtering gas used was a mixture of argon and 5% of oxygen ($O_2$). Sputtering conditions included a substrate temperature of 25° C., a deposition rate of 1 nm/min, an operating pressure of 0.5 Pa, and an input power of 5 $W/cm^2$. The inorganic insulative hole injecting and transporting layer as deposited had a composition of $SiO_{1.9}$.

With the vacuum kept, N,N,N',N'-tetrakis(m-biphenyl)-1,1'-biphenyl-4,4'-diamine (TPD), tris(8-quinolinolato) aluminum (Alq3), and rubrene were evaporated at an overall deposition rate of 0.2 nm/sec to a thickness of 100 nm, forming a light emitting layer. The layer consisted of a mixture of TPD and Alq3 at a TPD:Alq3 of 1:1 (volume ratio). The layer was doped with 10 vol % of rubrene.

The substrate was then moved to a sputtering apparatus wherein the high resistivity inorganic electron injecting layer was deposited to a thickness of 10 nm by using a target prepared by mixing $Li_2O$ with 4 mol % of V. The sputtering was carried out by feeding Ar at 30 SCCM and $O_2$ at 5 SCCM at room temperature (25° C.), and other sputtering conditions included a deposition rate of 1 nm/min, an operating pressure of 0.2 to 2 Pa, and an input power of 500 W. The composition of the high resistivity inorganic electron injecting layer formed was substantially the same as the target.

Next, with the vacuum kept, Al was evaporated to a thickness of 100 nm to form the negative electrode. Final sealing of a glass shield completed an organic EL device.

The resulting EL device was evaluated by driving the device in air at a constant current density of 10 $mA/cm^2$. The initial luminance was 790 $cd/m^2$, and drive voltage was 7.4 V.

Sheet resistance of the high resistivity inorganic electron injecting layer evaluated by four terminal method was 100 $k\Omega/cm^2$ at a thickness of 100 nm, and this resistance corresponds to the resistivity of $1 \times 10^9$ $\Omega \cdot cm$.

Example 2

In Example 1, the composition of the high resistivity inorganic electron injecting layer was changed by replacing $Li_2O$ with oxide of at least one element selected from alkaline metal elements such as Na, K, Rb, Cs, and Fr, alkaline earth metal elements such as Be, Mg, Ca, Sr, Ba and Ra; and lanthanide elements such as La, Ce, Pr, Nd, Pm, Sm, Eu, Gd, Tb, Dy, Ho, Er, Tm, Yb, and Lu, and substantially equivalent results were obtained.

The results were also equivalent when V was replaced with at least one element selected from Ru, Zn, Sm and In.

Example 3

An organic EL device was fabricated as in Example 1 except that, in the step of depositing the inorganic insulative hole injecting layer, the sputtering was conducted using the target comprising $SiO_2$ and the flow rate of $O_2$ in the sputtering gas was changed to a mix ratio of 5% in relation to Ar so that the resulting layer has the composition of $SiO_{1.9}$. The life properties of the resulting organic EL device were substantially equivalent to those of Example 1.

Organic EL devices were similarly fabricated by using the target comprising $SiO_2$ and changing the flow rate of $O_2$ in the sputtering gas to a mix ratio of 30% in relation to Ar so that the resulting layer has the composition of $SiO_{1.95}$; by using the target comprising $GeO_2$ and changing the flow rate of $O_2$ in the sputtering gas to a mix ratio of 30% in relation to Ar so that the resulting layer has the composition of $GeO_{1.96}$; by using the target comprising $Si_{0.5}Ge_{0.5}O_2$ and changing the flow rate of $O_2$ in the sputtering gas to a mix ratio of 10% in relation to Ar so that the resulting layer has the composition of $Si_{0.5}Ge_{0.5}O_{1.92}$. In the evaluation, substantially equivalent results were also obtained.

Comparative Example 1

In Example 1, the high resistivity inorganic electron injecting layer was formed by using a target prepared by mixing the raw materials of strontium oxide (SrO), lithium oxide ($Li_2O$), and silicon oxide ($SiO_2$) in the proportion:

SrO: 80 mol %, $Li_2O$: 10 mol %

$SiO_2$: 10 mol %, based on the entire components. The inorganic electron injecting and transporting layer was formed to a thickness of 0.5 nm. The deposition conditions of the inorganic electron injecting and transporting layer included a substrate temperature of 25° C., sputtering gas of Ar, a deposition rate of 1 nm/min, an operating pressure of 0.5 Pa, an input power of 5 $W/cm^2$, and $Ar/O_2$ of 1/1 fed at 100 SCCM.

Other conditions for producing the organic EL device were the same as those of Example 1. When the resulting organic EL device was evaluated by driving the device in air at a constant current density of 10 $mA/cm^2$, the initial luminance was 480 $cd/m^2$, and drive voltage was 9.8 V.

When the inorganic electron injecting layer was deposited to 10 nm, and the device was evaluated at a constant current density of 10 $mA/cm^2$, the initial luminance was 1 $cd/m^2$, and drive voltage was 19 V.

BENEFITS OF THE INVENTION

As described above, there is realized according to the present invention an organic EL device having an excellent electron and hole injecting efficiency and improved light emitting efficiency, which can be manufactured at reduced cost and which can be operated at low drive voltage.

What is claimed is:

1. An organic electroluminescent device comprising a hole injecting electrode, a negative electrode, and at least one organic layer between the electrodes; wherein at least one of said at least one organic layer has a light emitting function;

a high resistivity inorganic electron injecting layer is provided between said light emitting layer and said negative electrode, said high resistivity inorganic electron injecting layer comprising a first component having a work function of up to 4 eV which is oxide of at least one member selected from alkali metal elements, alkaline earth metal elements, and lanthanide elements, and a second component having a work function of 3 to 5 eV which is at least one metal, and said high resistivity inorganic electron injecting layer having conduction paths for electron transportation and which is capable of blocking the hole; and an inorganic insulative hole injecting and transporting layer is provided between said light emitting layer and said hole injecting layer, said inorganic insulative hole injecting and transporting layer containing oxide of silicon and/or germanium as its main component, and said main component having an average composition of:

$$(Si_{1-x}Ge_x)O_y$$

wherein $0 \leq x \leq 1$ and $1.7 \leq y \leq 1.99$.

2. The organic electroluminescent device of claim 1 wherein said second component is at least one member selected from Zn, Sn, V, Ru, Sm and In.

3. The organic electroluminescent device of claim 1 wherein said alkaline metal element is at least one member selected from Li, Na, K, Rb, Cs, and Fr; said alkaline earth metal element is at least one member selected from Mg, Ca and Sr; and said lanthanide element is at least one member selected from La and Ce.

4. The organic electroluminescent device of claim 1 wherein said high resistivity hole injecting layer has a resistivity of 1 to $1 \times 10^{11}$ Ω·cm.

5. The organic electroluminescent device of claim 1 wherein said high resistivity inorganic electron injecting layer contains 0.2 to 40 mol % of said second component based on the entire components.

6. The organic electroluminescent device of claim 1 wherein said high resistivity inorganic electron injecting layer has a thickness of 0.3 to 30 nm.

7. The organic electroluminescent device of claim 1 wherein said inorganic insulative hole injecting and transporting layer further comprises silicon oxide and/or germanium oxide as its stabilizer.

8. The organic electroluminescent device of claim 1 wherein said inorganic insulative hole injecting and transporting layer has a thickness of 0.1 to 5 nm.

* * * * *

UNITED STATES PATENT AND TRADEMARK OFFICE
CERTIFICATE OF CORRECTION

PATENT NO. : 6,284,394 B1
DATED : September 4, 2001
INVENTOR(S) : Michio Arai et al.

It is certified that error appears in the above-identified patent and that said Letters Patent is hereby corrected as shown below:

<u>Column 16,</u>
Line 30, "alkaline" should read -- alkali --.

Signed and Sealed this

Second Day of April, 2002

Attest:

Attesting Officer

JAMES E. ROGAN
*Director of the United States Patent and Trademark Office*